(12) United States Patent
Lombardo et al.

(10) Patent No.: US 9,006,558 B2
(45) Date of Patent: Apr. 14, 2015

(54) SOLAR PANEL HAVING MONOLITHIC MULTICELL PHOTOVOLTAIC MODULES OF DIFFERENT TYPES

(75) Inventors: Salvatore Lombardo, Catania (IT); Salvatore Coffa, Tremestieri Etneo (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 617 days.

(21) Appl. No.: 12/703,904

(22) Filed: Feb. 11, 2010

(65) Prior Publication Data
US 2010/0200043 A1      Aug. 12, 2010

(30) Foreign Application Priority Data
Feb. 12, 2009 (IT) .............................. VA2009A0011

(51) Int. Cl.
| H01L 31/042 | (2014.01) |
| H01L 31/048 | (2014.01) |
| H01L 31/0392 | (2006.01) |
| H01L 31/043 | (2014.01) |
| H01L 31/046 | (2014.01) |
| H02S 40/32 | (2014.01) |

(52) U.S. Cl.
CPC ............. *H01L 31/048* (2013.01); *Y02E 10/541* (2013.01); *Y02E 10/548* (2013.01); *H01L 31/03921* (2013.01); *H01L 31/03923* (2013.01); *H01L 31/043* (2014.12); *H01L 31/046* (2014.12); *H02S 40/32* (2014.12)

(58) Field of Classification Search
CPC ................................................ H01L 31/02008
USPC ................................................. 136/249, 244
See application file for complete search history.

(56) References Cited

U.S. PATENT DOCUMENTS

| 4,680,422 A | 7/1987 | Stanbery |
| 4,784,701 A * | 11/1988 | Sakai et al. .................... 136/249 |
| 4,847,669 A | 7/1989 | Yamazaki et al. |
| 4,914,044 A | 4/1990 | Grabmaier et al. |
| 5,071,490 A | 12/1991 | Yokota et al. |

(Continued)

OTHER PUBLICATIONS

Green et al., "Solar Cell Efficiency Tables", ARC Photovoltaics Centre of Excellence, Prog. Photovolt: Res. Appl. 2008, Jun. 2008, pp. 435-440.

*Primary Examiner* — James Lin
*Assistant Examiner* — Dujuan Horton
(74) *Attorney, Agent, or Firm* — Allen, Dyer, Doppelt, Milbrath & Gilchrist, P.A.

(57) ABSTRACT

A solar panel may include a first multi-cell thin-film photovoltaic module of a first fabrication type including a transparent support forming a front surface of the panel, a first pair of connection terminals on the transparent support, and first cells of a certain area, being on the transparent support, and being connected in series to the first pair of connection terminals. The solar panel may include a second multi-cell thin-film photovoltaic module of a second fabrication type comprising a support forming a rear surface of the panel, a second pair of connection terminals on the support, and second cells of a certain area, being on the support, and being connected in series to the second pair of connection terminals. The solar panel may further include a pair of panel terminals for connecting the solar panel to an external circuit, the first and second pairs of connection terminals being connected either in series or in parallel, and then connected to the external circuit through the panel terminals, or both connected to a maximum power point tracker and then connected to the external circuit through the panel terminals.

14 Claims, 4 Drawing Sheets

(56) References Cited

U.S. PATENT DOCUMENTS

| | | |
|---|---|---|
| 5,458,694 A | 10/1995 | Nuyen |
| 5,578,503 A * | 11/1996 | Karg et al. ............ 438/95 |
| 6,111,188 A | 8/2000 | Kurokami et al. |
| 6,288,323 B1 * | 9/2001 | Hayashi et al. ............ 136/244 |
| 6,368,892 B1 | 4/2002 | Arya ............ 438/96 |
| 2001/0007262 A1 * | 7/2001 | Matsushita et al. ............ 136/256 |
| 2003/0047207 A1 * | 3/2003 | Aylaian ............ 136/244 |
| 2006/0207645 A1 * | 9/2006 | Wada ............ 136/244 |

* cited by examiner

SOLAR PANEL HAVING MONOLITHIC MULTICELL PHOTOVOLTAIC MODULES OF DIFFERENT TYPES

FIELD OF THE INVENTION

This disclosure relates to photovoltaic conversion of energy and, in particular, to solar panels fabricated with a thin film technology.

BACKGROUND OF THE INVENTION

Thin film solar panels are gaining ever more recognition in the field of solar panels because of their relative low cost compared to panels of traditional technology using silicon wafers. Solar panels based on a photovoltaic structure using a semiconductor layer of cadmium telluride (CdTe) deposited on a glass sheet attain conversion costs smaller than $2.00 per watt and are rapidly approaching about $1.00 per watt.

Other thin film technologies of ternary or quaternary chalcogens are the so-called photovoltaic structures CIS (Copper Indium di-Selenide) and CIGS (Copper Indium Gallium di-Selenide) that promise conversion yields above 10% at very competitive costs.

Similar efficiencies values have been obtained using a thin film technology based on hydrogenated amorphous silicon (a-Si:H). Besides the smaller cost of metallurgic silicon as compared to the cost of elements, such as cadmium, indium, tellurium, there is the further advantage of not including toxic materials, such as, for example, cadmium. Thus, they would be more safely disposed of in the environment without using costly processes for recovering substances that cannot be dispersed in the environment, at the end of the working life of panels.

Among the numerous factors that may influence the choice of a thin film technology among the available technologies, it should be considered that among these thin film fabrication technologies of solar panels, there are important differences in functioning at the various wavelengths of the solar spectrum.

A hydrogenated amorphous silicon photovoltaic structure (p-i-n or n-i-p diode) has a relatively large band gap (slightly less than 2 eV) that makes the semiconductor particularly efficient in converting the blue portion of the solar spectrum, but not so in the red portion of the solar spectrum. Moreover, hydrogenated amorphous silicon tends to significantly "trap" carriers (in particular holes), thus keeping the thickness of the intrinsic semiconductor layer (i) (i.e. the absorption-conversion region) of the p-i-n or n-i-p structures within a few hundred nanometers. In addition, hydrogenated amorphous silicon undergoes an "aging" process, generally attributed to hydrogen desorption by structural defects of the material (the D-centers). All these characteristics may lead to the use of hydrogenated amorphous silicon as part of a relatively thin p-i-n or n-i-p structure, which is adapted to absorb blue-green radiation of the solar spectrum.

As far as the absorption exploitation of the red radiation part of the solar spectrum is concerned, it is either neglected for privileging a reduced cost of panels or done by a second tandem photovoltaic structure of a different semiconductor or by realizing stacked multi-junction photovoltaic structures. Semiconductors generally used for a tandem or multi-junction structure associated to a hydrogenated amorphous silicon structure, are microcrystalline silicon, hydrogenated silicon-germanium alloys (a-SiGe:H), ternary chalcogens (for example, CIS) or quaternary chalcogens (for example CIGS). See U.S. Pat. No. 6,368,892. Tandem structures of hydrogenated amorphous silicon and of microcrystalline silicon are known in the industry as micromorphic cells. These as well as other developments based on tandem or multi-junction structures are efficient, but up to now, they have lead to power conversion yields that at the most attain, at module level, 13% (see Martin A. Green, Keith Emery, Yoshihiro Hishikawa and Wilhelm Warta, Prog. Photovolt: Res. Appl. 2008; 16:61-67), i.e. well below the theoretical limit of the single photovoltaic structures combined together.

As it is known to the skilled person, certain characteristics of the thin film technology, with respect to other technologies, may negatively counterbalance certain positive characteristics of otherwise superior thin film technologies.

Micromorphic cells, that are promising from the point of view of cost and reliability, may suffer the drawback of a short-circuit current yield far lower than the theoretical limit. This is due to poor absorption capability of radiation in the red region of the solar spectrum. An increase of thickness of the microcrystalline intrinsic semiconductor material alleviates this problem, but it may imply a significant increase of costs.

By contrast, CIS and CIGS semiconductor structures are efficient even if in thin film form, in the order of 1.0 μm thickness. This is due to the fact that, differently from amorphous and microcrystalline silicon, these materials are direct band gap semiconductors capable of efficiently capturing photons even in very thin films. Up to now, the best results have been obtained with semiconductors, i.e. CIS or CIGS, having a low band gap, even if practical limits due to recombination of carriers in the region of spatial charge of the photovoltaic conversion structure are present.

As for amorphous silicon, even with these chalcogen materials it is possible to adjust the band gap value, for example, by exchanging Ga and In contents in CIGS. However, when increasing the band-gap from 1.0 to about 1.5 eV, a reduction of the power conversion yield by a factor of about 2 is observed. This indicates an intrinsic inefficiency of chalcogen photovoltaic cells in converting the blue portion of the solar spectrum.

An ideal structure appears to be a combination of a CIS, CIGS or CdTe converting structure and an amorphous silicon converting structure. The resulting combined photovoltaic structure efficiently converts both the red portion as well as the blue portion of the solar spectrum. See U.S. Pat. No. 6,368,892. Solar light crosses first an amorphous silicon structure photovoltaic diode that absorbs and converts radiation of wavelength in the blue region of the spectrum while the remaining green-red portion of the spectrum crosses the silicon diode, being only marginally absorbed, and it is efficiently absorbed and converted by an underlying CIS, CIGS or CdTe converting structure made of direct gap semiconductor material of a thickness sufficient to absorb substantially all the radiation reaching it.

Typically, this type of prior art conversion "stack" is monolithic and has the drawback that cells of the two photovoltaic conversion structures of different technology are electrically in series and thus crossed by the same current. This may significantly limit the overall power conversion yield.

SUMMARY OF THE INVENTION

It has been found that the attendant overall active area penalization due to the practice of designing these stack architectures of multi-cell photovoltaic structures of different technology, the stacked cells of which are intrinsically in series and absorb more or less complementarily radiation of distinct regions of the solar spectrum to generate as far as possible the same current per unit area, may be avoided, and that the overall power yield increase is significant.

By not imposing that cells of different technology generate the same current per unit area, it becomes possible, for example, to absorb and convert effectively the blue radiation of the spectrum with a photovoltaic structure of cells with a suitably thin amorphous silicon layer (a-Si:H), notwithstanding the fact that they deliver a relatively low current per unit area (JSC), and absorb and convert radiation of the remaining part of the spectrum with an underlying photovoltaic structure of cells of intrinsic semiconductor based on chalcogens such as, for example, $CuInTe_2$, $CuInSe_2$, $CuGaTe_2$, $CuGaSe_2$ or CdTe, without the binding condition of having the same JSC in the cells of monolithic stacked multi-cell photovoltaic structures of different technology according to the related prior art practice.

Another potential drawback of the prior art practice that is overcome by the architecture of this disclosure is represented by the fact that present fabrication technologies of multi-cell photovoltaic structures, typically a-Si:H, CIGS, CIS and CdTe, are very much different and the realization of photovoltaic modules of hybrid monolithically stacked structures are difficult to manufacture.

According to the disclosure, a solar panel may comprise two distinct monolithic photovoltaic conversion modules, the photosensitive structure of one of the two modules being formed on a transparent planar support that constitutes the front of the panel to be illuminated by solar radiation while the photosensitive structure of the other module is formed on a distinct planar support parallel to and at a certain distance under the transparent support of the first module. The second planar support may even be of an opaque material and generally constitutes the rear of the solar panel.

The multi-cell photovoltaic structures of the front side module are of a different technology than the multi-cell photovoltaic structures of the rear side module of the solar panel and have light absorption characteristics adapted to individually convert photonic energy at a high yield in different regions, more or less complementary, of the solar spectrum. The distinct multi-cell photovoltaic structures of the two separately fabricated conversion modules may be optimally and precisely designed either for generating similar voltages or to deliver a current as much as possible similar under all or prevailing conditions of illumination of the composite two-technologies solar panel.

Optionally, the two distinct photovoltaic modules of the solar panel may be independently connected in the power plant. The two distinct photovoltaic modules may comprise a plurality of panels, according to an optimized series-parallel scheme of the modules (or of the panels) that may even be of an adaptive type, with appropriate path selectors controlled by a dedicated control system.

According to one embodiment, one of the two modules (usually the less efficient) is first redesigned by changing the number of cells and their size in order to produce the same current as that of the other module, and then the two modules are connected in series during the back-end phases of fabrication of the solar panel through ordinary welding, bonding, or equivalent connecting techniques of metal conductors before encapsulating and joining together the two separately supported modules with a transparent low absorption resin, for example, ethylene vinyl acetate (EVA).

According to a second embodiment, one of the two modules (usually the less efficient) is first redesigned by changing the number of cells and their size in order to produce the same voltage at the maximum power point or in open circuit as that of the other module, and then the two modules are connected in parallel during the back-end phases of fabrication of the solar panel through ordinary welding, bonding, or equivalent connecting techniques of metal conductors before encapsulating and joining together the two separately supported modules with a transparent low absorption resin, for example, EVA.

According to an embodiment, the two modules may be factory connected in series or in parallel during back-end phases of fabrication of the solar panel, through ordinary welding, bonding or equivalent connecting techniques of metal conductors before encapsulating and joining together the two separately supported modules with a transparent low absorption resin, for example, with ethylene vinyl acetate (EVA). According to another embodiment, the electrical connection of the two distinct photovoltaic modules of the panel to two electrical terminals of the solar panel takes place through a dedicated MPPT (Maximum Power Point Tracker) circuit having two pairs of input nodes for the respective modules. The MPPT circuit may be encapsulated inside the panel during the resin encapsulation and bonding process of the modules (for example, using EVA), or may be installed inside the so-called "junction box" of the panel.

The active area of each cell, the number of cells and thus the overall active area of the photovoltaic structure of each module are parameters definable independently for each of the two modules, taking into account the scheme of connection of the two modules of the panel to the external circuit of the power plant. According to another embodiment, on the inner surface of a planar transparent support, typically a sheet of glass, is realized a first multi-cell photovoltaic conversion structure based on a hydrogenated amorphous silicon (a-Si:H) layer of a thickness between about 100 and 500 nm, as an intrinsic semiconductor layer of a n-i-p (or p-i-n) diode structure. The functioning n-i-p (or p-i-n) diode structure may include a first transparent film of a conducting material (TOO), for example, tin oxide doped with fluorine ($SnO_2$:F), zinc oxide doped with aluminium (ZnO:Al), a mixed oxide of zinc and indium, or other mixed oxides and sub-stoichiometric oxides that have a sufficient electric conductivity, that may be deposited directly on the inner face of the support glass layer and thereafter defined by laser scribing, screen printing, pad printing, and successive etching or equivalent technique commonly used for this type of cell structure. The functioning n-i-p (or p-i-n) diode structure may include a second transparent film of a conducting material (TCO) deposited on the semiconductor hydrogenated amorphous silicon layer after its deposition over the patterned first TCO film, which are defined with any of the techniques already mentioned for the first TCO film.

The definition of the deposited layers may be carried out for realizing a multi-cell structure of distinct (unit) diodes or photovoltaic conversion cells being electrically connected in series through the defined TCO current collectors and eventually in groups or strings of unit diodes in series connected in parallel. On the inner face of a second planar support that may also be opaque, for example, a cermet agglomerate, a ceramic or of a metal plate coated with a layer of conducting material, for example, an alloy of copper, steel, titanium, aluminium, the inner surface of which is made electrically insulated or by a layer of oxides grown or deposited on the metal surface of by a ceramic or pyroceram layer, is realized a multi-cell photovoltaic structure based on $CuInTe_2$, $CuInSe_2$, $CuGaTe_2$, $CuGeSe_2$ or CdTe (i.e. a CIS, CIGS or CdTe) structure.

The semiconductor layer of the photovoltaic structure may be formed between a first current collector, in the form of a patterned layer of aluminium or of another metal or metal alloy, and a transparent film of a conducting material (TCO), that is eventually patterned together with the underlying semiconductor layer by any one of commonly used techniques of laser scribing, screen printing, pad printing techniques followed by etching. Each of the two modules, so independently constituted, has metal pads, respectively of positive and negative sign of the multi-cell photovoltaic structure, to which are connected, according to a design series-parallel interconnection scheme, single cells of a design active area that include the multi-cell structure.

DETAILED DESCRIPTION OF THE PREFERRED EMBODIMENTS

Figure 1:
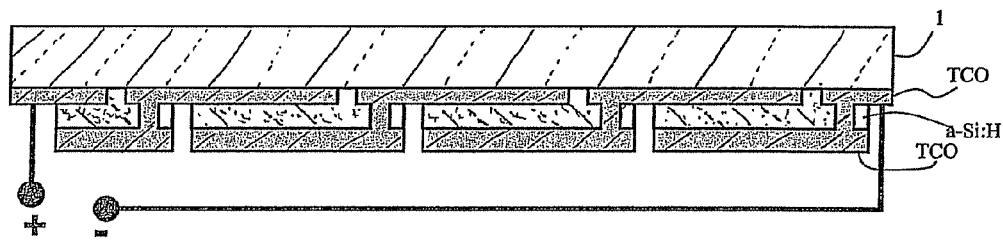
FIG. 1 is a cross-sectional view of a first photovoltaic module comprising a plurality of cells in series, according to the present invention.
Figure 2:
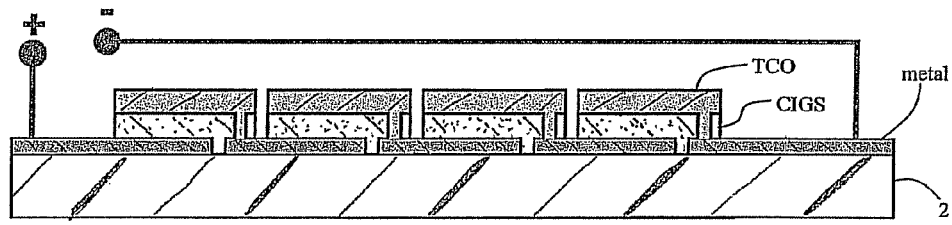
FIG. 2 is a cross-sectional view of a second multi-cell photovoltaic module comprising a plurality of cells in series, according to the present invention.

Referring to FIGS. 1 and 2, two photovoltaic modules of different technology for maximizing absorption through the whole solar spectrum may have a different number of cells and different active areas. In practice, the overall active area of the multi-cell photovoltaic structure of a first module may differ from that of the other module. In the considered example, the first photovoltaic module, illustrated in FIG. 1, comprises a multi-cell photovoltaic structure with a semiconductor layer of hydrogenated amorphous silicon (a.Si:H), formed on a transparent substrate 1, for example, on a glass pane or on an equivalent transparent material.

FIG. 1 shows two transparent conducting current collectors of TCO and the semiconductor layer of hydrogenated amorphous silicon a-Si:H, the photosensitive p-i-n or n-i-p diode structure. The stacked layers are deposited in succession on the surface of the inner side or face of the transparent support 1. The deposited layers are defined through an appropriate technique, for example, laser scribing, screen printing patterning of etching lines of the deposited layer, pad printing or any other equivalent masking/printing techniques normally used in the industry.

It may be observed that the stacked layers may be commonly defined by forming interruption lines at identical intervals, properly staggering the mask or the laser tracking position layer-by-layer. In the case of a hydrogenated amorphous silicon (a-Si:H) photovoltaic structure, after having formed a conducting layer of TCO on the inner surface of the transparent support 1 and having defined interconnected electrodes of distinct diodes (photovoltaic cells) through CVD or similar techniques, a P type semiconductor layer, an intrinsic layer of undoped hydrogenated amorphous silicon (a-Si:H), and a N type semiconductor layer are deposited and patterned in sequence, then a layer of conducting oxide TCO is deposited or grown thereon, which on its turn may be patterned for realizing interconnected counter-electrodes of the distinct diodes (photovoltaic cells). In this way, strings of cells coupled electrically in series are defined.

FIG. 2 shows the scheme of a CIGS photovoltaic structure formed on the inner side surface of the support 2 of the second module that may be of opaque material, for example, a metal sheet having a dielectric coat of a ceramic, or glass-ceramic or a dielectric oxide layer. Similarly to the first module, also for the second module of FIG. 2, the layers that form the functioning photovoltaic CIGS may be deposited in succession, defining unit cell geometry with techniques similar to those used for defining the layers of the multi-cell photovoltaic structure of FIG. 1. All the drawings are purely schematic and not to scale.

For the considered example, the intrinsic semiconductor layer of amorphous silicon (a-Si:H) may have a thickness generally comprised between 100 and 500 nm, and the intrinsic semiconductor layer of the CIGS structure may have a thickness generally comprised between about 0.5 μm and about 4 μm. As schematically illustrated, the area of the single cells and the number of cells in which the photovoltaic CIGS structure is subdivided generally differ from those of the photovoltaic structure of the module of FIG. 1 of amorphous silicon.

Figure 3:
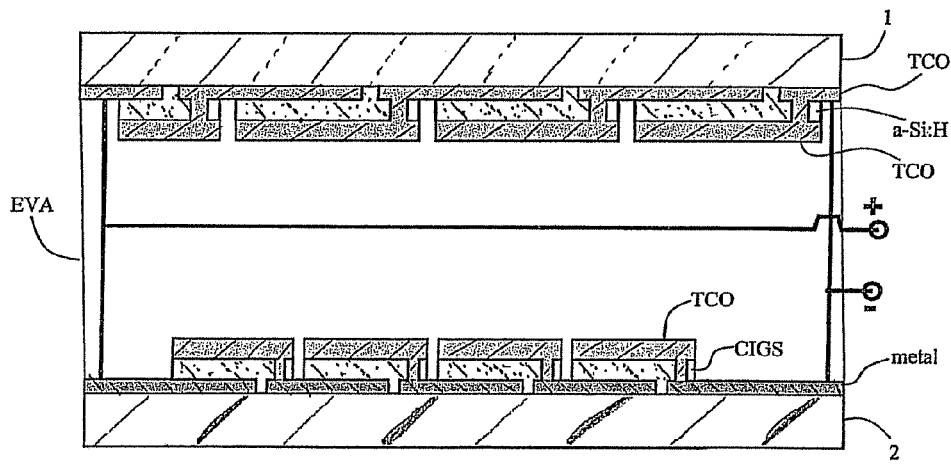
FIG. 3 is a cross-sectional view of the architecture of a solar panel, in which one of the two modules or both are redesigned by changing the number of cells and their size in order to produce the same voltage at the maximum power point or in open circuit as that of the other module, and then the two modules are connected in parallel, according to the present invention.

As schematically illustrated in FIG. 3, the two modules of FIGS. 1 and 2 are joined together to constitute a solar panel, the illuminated face of which is the external surface of the transparent support 1 of the first photovoltaic module of amorphous silicon of FIG. 1, and the bottom of the solar panel is the outer side surface of the support 2 of the second CIGS photovoltaic module of FIG. 2. Coupling is preferably carried out by joint encapsulation of the two distinct multi-cell photovoltaic structures with an appropriate heat moldable resin, commonly with EVA or equivalent low loss transparent resin.

In practice, the fluidized transparent resin may be injected or compressed in the separation gap between the two multi-cell photovoltaic structures, thus encapsulating the plurality of cells and the conductors of electrical connection of the two structures, such to form (upon solidification of the resin) a solid composite body of a panel, the rear and front sides of which are respectively constituted by the opaque support 2 and by the transparent support 1 of the two modules so permanently joined by the solidified transparent EVA resin that also fills all gaps.

The separation gap between the two structures, which is completely filled by the encapsulation resin of the two structures, may have a thickness generally comprised between 0.5 and 10 mm. Parallel connection of the two distinct photovoltaic modules that comprise the solar panel may satisfy the design standard of the power plant that the two modules of the panel generate the same voltage at the maximum power point or in open circuit with good approximation, at least under prevalent conditions of illumination of the panel. In this case, it can be proved that the power produced by the composite module under illumination may be practically coincident with the maximum possible power generated by the two independently optimized modules.

Figure 4:
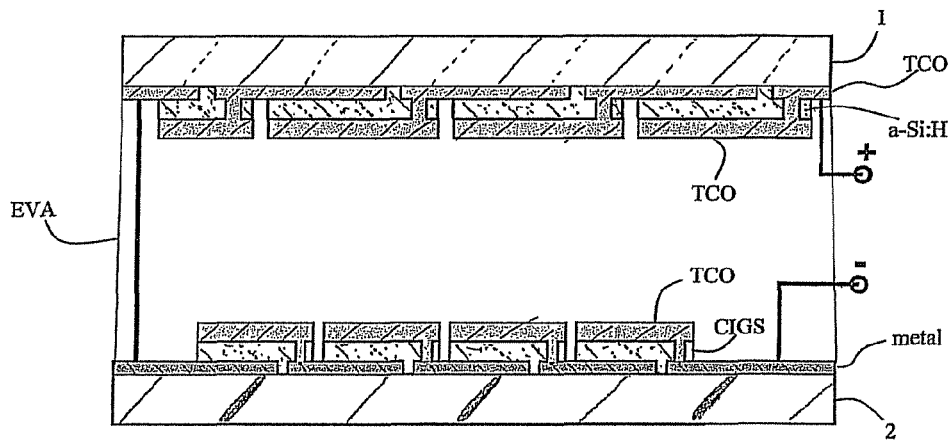
FIG. 4 is a cross-sectional view of a solar panel where the two distinct modules are electrically connected in series, in which one of the two modules or both are redesigned by changing the number of cells and their size to produce the same current as that of the other module, and then the two modules are connected in series, according to the present invention.

Referring to FIG. 4, connection of the two modules may alternatively be in electrical series, satisfying the design standard of the power plant that the two photovoltaic modules generate with good approximation the same current under short current condition, at least under prevalent conditions of illumination such to add efficiently the power delivered by the two modules of different technology of the panel. Also in this embodiment, it can be proved that the power produced by the composite module under illumination is practically coincident with the maximum possible power generated by the two independently optimized modules.

Figure 5:
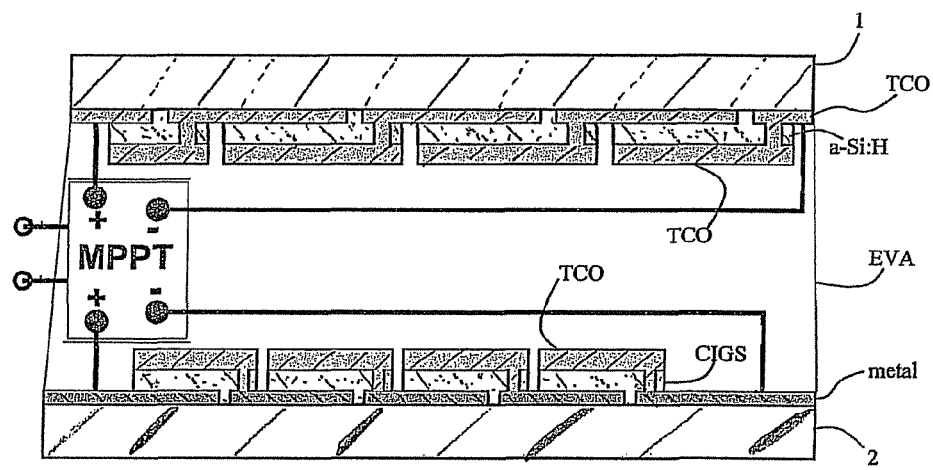
FIG. 5 is a cross-sectional view of a solar panel where the two distinct modules are electrically coupled through a MPPT converting circuit integrated in the encapsulation process or in the junction box, according to the present invention.

According to another embodiment of the panel architecture, the two different photovoltaic conversion modules are designed without imposing beforehand that they generate the same current or voltage and the two modules are electrically coupled through a dedicated MPPT (Maximum Power Point Tracker) converting circuit, that optimizes the instantaneous power yield of the solar panel at the varying conditions of illumination of the active surface area of the panel. The MPPT circuit may be, as schematically shown in FIG. 5, encapsulated in the composite body of the panel during the encapsulation phase of the two modules, or alternatively the MPPT circuit may be installed in the junction box of the solar panel. The outer surface of the transparent support 1 of the front module of the panel may be textured according to common practice for maximizing capturing of solar light and/or provided with a coat of an anti-reflective material, for example, silicon nitride, titanium or silicon oxide, dielectric multilayers of the same or of other equivalent materials, the thickness of which generally does not exceed 500 nm, though it may be even thicker.

Figure 6:
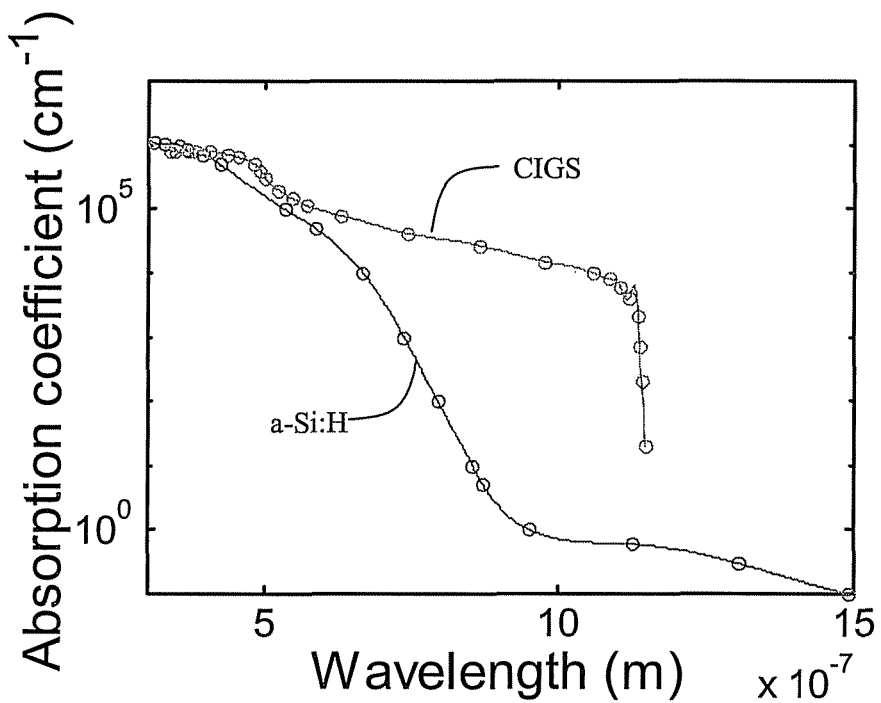
FIG. 6 depicts the different absorption characteristics of a photovoltaic structure of amorphous silicon and of a photovoltaic CIGS structure, according to the present invention.
Figure 7:
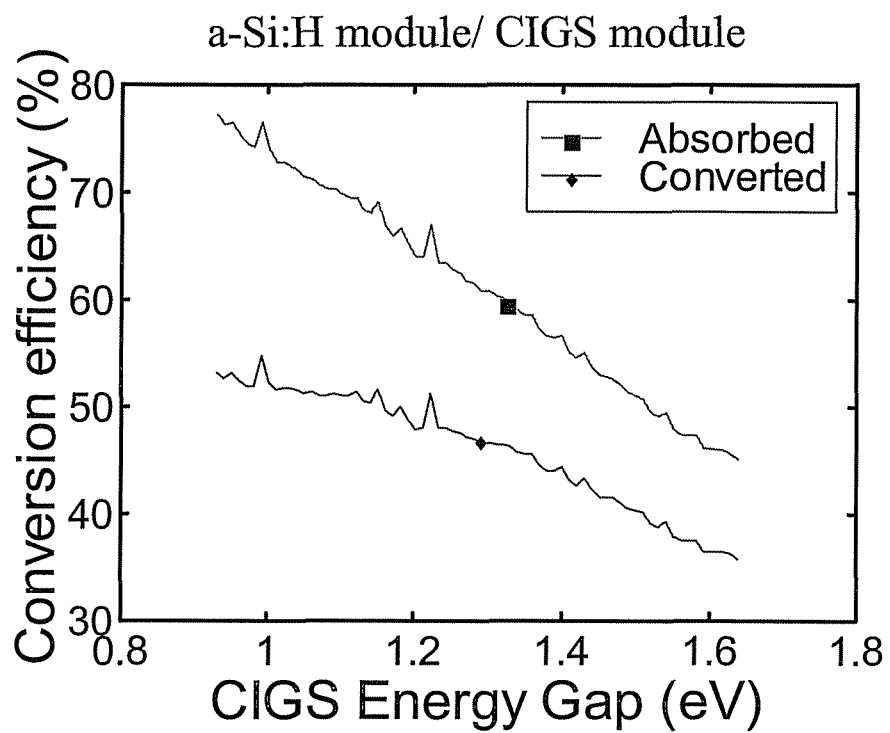
FIG. 7 depicts absorption and conversion curves with illumination AM1.5 G of a solar panel comprising a hydrogenated amorphous silicon (300 nm) module formed on a transparent support and an underlying photovoltaic module CIGS (2 μm), assuming null losses, according to the present invention.

FIG. 6 shows characteristic absorption curves of a photovoltaic structure of hydrogenated amorphous silicon (300 nm) and of a CIS photovoltaic structure (2 μm) with a lighting of AM1.5G. FIG. 7 depicts characteristic absorption curves with a lighting AM1.5G of a solar panel comprising a photovoltaic module of hydrogenated amorphous silicon, with thickness of the intrinsic semiconductor layer of 300 nm, and an underlying CIS photovoltaic module, with thickness of the intrinsic semiconductor layer of 2 μm, assuming null power losses. The calculated optimal coupling is for a CIS structure having a band gap of about 1 eV. This standard is satisfied by a CIS structure of CuInSe2, though other chalcogens such as CuInTe2, CuInSe2, CuGaTe2, CuGaSe2 and CdTe would have equally satisfying performances.

Ideally, the maximum power conversion yield that may be attained may approach about 50%, but this level is not practically attainable because of unavoidable optical "mismatches" (parasitic reflections due to the difference of refraction index in correspondence of interfaces), recombination of photo-carriers and light absorbed by the "inert" layers (TCO, EVA, doped semiconductor layer for contacting TCO or metal electrodes, etc.). These effects are neglected in calculations for obtaining the graphs of FIGS. 7 and 8. Nevertheless, the optimization of the structures may significantly increase the performance and approach the ideal case. This is what has occurred, for example, in the case of crystalline silicon, wherein properly optimized device structures are significantly close to the theoretical limit.

Figure 8:
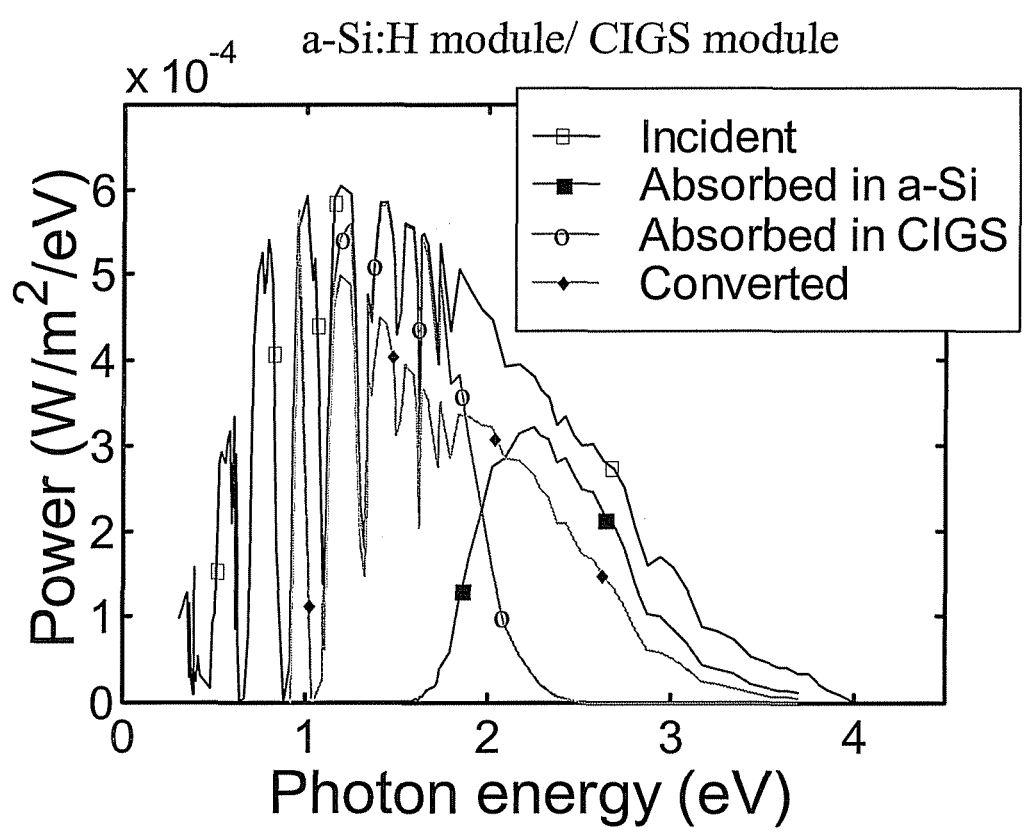
FIG. 8 depicts spectral distribution of the impinging radiant power, of the absorbed power by the amorphous silicon structure, of the absorbed power by the CIGS structure and of the electrical power produced by the solar panel, according to the present invention.

FIG. 8 illustrates the spectral distribution of the impinging radiant power, of the absorbed power by the amorphous silicon structure, of the power absorbed by the CIGS structure and of the spectral distribution of converted power. As stated above, the shown values rest on a number of ideal assumptions and in particular, by assuming null reflectivity at every interface crossed by radiation, no recombination and no Ohmic losses. Nevertheless, by considering that yields in the order of 15-20% and 8-10% may be obtained respectively from the CIGS module and in the overhanging amorphous silicon module, it is realistic to conclude that, by eliminating any cross-constraint between the two photovoltaic structures of different technology, it is possible to optimize the "match" between the characteristics of different photovoltaic structures and the respective region of the solar spectrum (the amorphous silicon structure being most adapted to convert into electric power the radiation of a blue portion of the spectrum, and the CIGS structure being most adapted to convert into electric power the radiation of a red portion of the spectrum), thus an overall power conversion yield up to about 30% may be obtained with the solar panel architecture of this disclosure.

That which is claimed:

1. A solar panel (Sakai) comprising:
a first multi-cell module comprising
a transparent common substrate forming a front surface of the solar panel,
a first pair of terminals on said transparent common substrate, and
a first plurality of cells being on said transparent common substrate, and configured to be coupled in series to said first pair of terminals, each first cell having a first area and comprising a p-i-n/n-i-p structure with an intrinsic layer comprising thin-film hydrogenated amorphous silicon, and a transparent film of a conducting material (TCO) layer over said p-i-n/n-i-p structure;
a second multi-cell photovoltaic module comprising
a common substrate forming a rear surface of the solar panel,
a second pair of terminals on said common substrate, and
a second plurality of cells being on said common substrate, and being configured to be coupled in series to said second pair of terminals, each second cell having a second area being different than the first area and comprising a Copper Indium Gallium di-Selenide structure, and a TCO layer over said Copper Indium Gallium di-Selenide structure, the Copper Indium Gallium di-Selenide having a band-gap between 0.9 and 1.3 eV; and
a pair of panel terminals configured to couple the solar panel to an external circuit, said first and second pairs of terminals configured to be coupled to said pair of panel terminals;
said first and second pluralities of cells configured to equalize at least one of current generation and voltage generation.

2. The solar panel according to claim 1 wherein said first and second pairs of terminals are configured to be coupled in series to said pair of panel terminals.

3. The solar panel according to claim 1 wherein said first and second pairs of terminals are configured to be coupled in parallel to said pair of panel terminals.

4. The solar panel according to claim 1 further comprising a power point tracker converter circuit configured to selectively couple said first and second pairs of terminals to said pair of panel terminals.

5. The solar panel according to claim 1 further comprising a layer of transparent resin between said first and second multi-cell photovoltaic modules.

6. The solar panel according to claim 1 wherein said intrinsic layer of each first cell has a thickness between about 100 and 500 nm; and wherein each second cell includes an intrinsic layer thickness between 0.5 and 4 μm.

7. The solar panel according to claim 6 wherein said thin-film hydrogenated amorphous silicon has a band-gap between 1.5 and 2 eV.

8. A solar panel comprising:
    a first photovoltaic module comprising
        a transparent common substrate,
        a first pair of terminals carried by said transparent common substrate, and
        a first plurality of cells carried by said transparent common substrate and configured to be coupled to said first pair of terminals, said first plurality of cells configured to absorb at least one first portion of the solar spectrum, each first cell having a first area and comprising a p-i-n/n-i-p structure with an intrinsic layer comprising thin-film hydrogenated amorphous silicon, and a transparent film of a conducting material (TCO) layer over said p-i -n/n-i-p structure;
    a second photovoltaic module being stacked with said first photovoltaic module and comprising
        a common substrate,
        a second pair of terminals carried by said common substrate, and
        a second plurality of cells carried by said common substrate and configured to be coupled to said second pair of terminals, said second plurality of cells configured to absorb at least one second portion of the solar spectrum different than the at least one first portion of the solar spectrum, each second cell having a second area different than the first area and comprising a Copper Indium Gallium di-Selenide structure, and a TCO layer over said Copper Indium Gallium di-Selenide structure, the Copper Indium Gallium di-Selenide having a band-gap between 0.9 and 1.3 eV;
    said first and second pluralities of cells configured to equalize at least one of current generation and voltage generation.

9. The solar panel according to claim 8 wherein said first and second pairs of terminals are configured to be coupled in series.

10. The solar panel according to claim 8 wherein said first and second pairs of terminals are configured to be coupled in parallel.

11. The solar panel according to claim 8 further comprising a power point tracker converter circuit configured to selectively couple said first and second pairs of terminals.

12. A solar panel comprising:
    a first multi-cell photovoltaic module comprising
        a transparent common substrate forming a front surface of the solar panel,
        a first pair of terminals on said transparent common substrate, and
        a first plurality of cells being on said transparent common substrate, and configured to be coupled in series to said first pair of terminals, each first cell having a first area and comprising a p-i-n/n-i-p structure with an intrinsic layer comprising thin-film hydrogenated amorphous silicon, and a transparent film of a conducting material (TCO) layer over said p-i-n/n-i-p structure;
    a second multi-cell photovoltaic module comprising
        an opaque common substrate forming a rear surface of the solar panel,
        a second pair of terminals on said opaque common substrate, and
        a second plurality of cells being on said opaque common substrate, and configured to be coupled in series to said second pair of terminals, each second cell having a second area, the second area being different than the first area and comprising a Copper Indium Gallium di-Selenide structure, and a TCO layer over said Copper Indium Gallium di-Selenide structure, the Copper Indium Gallium di-Selenide having a band-gap between 0.9 and 1.3 eV;
    a pair of panel terminals configured to couple the solar panel to an external circuit; and
    a power point tracker converter circuit configured to selectively couple said first and second pairs of terminals in either parallel or in series to said pair of panel terminals;
    said first and second pluralities of cells configured to equalize at least one of current generation and voltage generation.

13. The solar panel according to claim 12 further comprising a layer of transparent resin between said first and second multi-cell photovoltaic modules.

14. The solar panel according to claim 12 wherein said intrinsic layer of each first cell has a thickness between 100 and 500 nm; and wherein each second cell includes an intrinsic layer thickness between 0.5 and 4 μm.

* * * * *